United States Patent
Enomoto et al.

(10) Patent No.: US 11,101,090 B2
(45) Date of Patent: Aug. 24, 2021

(54) DIGITAL SIGNAL OUTPUT DEVICE THAT OUTPUTS A DIGITAL SIGNAL IN ACCORDANCE WITH OPERATION SWITCH

(71) Applicant: FANUC CORPORATION, Yamanashi (JP)

(72) Inventors: Minoru Enomoto, Yamanashi (JP); Tetsuro Matsudaira, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/815,004

(22) Filed: Mar. 11, 2020

(65) Prior Publication Data

US 2020/0303143 A1   Sep. 24, 2020

(30) Foreign Application Priority Data

Mar. 18, 2019   (JP) .............................. JP2019-049846

(51) Int. Cl.
*H02M 3/157*   (2006.01)
*H01H 47/00*   (2006.01)
*G08B 21/18*   (2006.01)
*G08B 25/00*   (2006.01)

(52) U.S. Cl.
CPC ........... *H01H 47/00* (2013.01); *G08B 21/182* (2013.01); *G08B 25/00* (2013.01)

(58) Field of Classification Search
CPC ...... G08B 21/182; G08B 25/00; H01H 47/00; H01H 9/16; H01H 1/0015; H01H 47/002; G01R 31/3277
See application file for complete search history.

(56) References Cited

U.S. PATENT DOCUMENTS

| 8,803,478 | B2* | 8/2014 | Yang ................ G01R 31/3835 320/118 |
| 9,157,963 | B2* | 10/2015 | Li ..................... G01R 31/3835 |
| 2013/0057294 | A1* | 3/2013 | Mizoguchi ............ G01R 1/00 324/434 |

(Continued)

FOREIGN PATENT DOCUMENTS

| JP | H11-161391 A | 6/1999 |
| JP | 2005229693 A | 8/2005 |

(Continued)

*Primary Examiner* — Jared Fureman
*Assistant Examiner* — Esayas G Yeshaw
(74) *Attorney, Agent, or Firm* — Hauptman Ham, LLP

(57) ABSTRACT

A digital signal output device includes: an operation switch including contacts, a first terminal to which a first voltage is applied and a second terminal from which the first voltage is outputted when the contacts are closed; a voltage switching unit configured to select a second voltage from among a plurality of constant voltages; a voltage determination unit configured to determine on a designated cycle whether or not a voltage outputted from the voltage switching unit has changed from the second voltage; and a digital signal generation unit configured to, when the voltage determination unit determines that the voltage has not changed from the second voltage, generate on every cycle a digital signal indicating a first state when the first voltage is outputted from the second terminal and a digital signal indicating the second state when the first voltage is not outputted therefrom.

8 Claims, 13 Drawing Sheets

(56) References Cited

U.S. PATENT DOCUMENTS

| | | | |
|---|---|---|---|
| 2014/0313608 A1* | 10/2014 | Nakabayashi | H02M 3/1584 |
| | | | 360/39 |
| 2016/0260409 A1* | 9/2016 | Lin | H02M 3/07 |
| 2017/0187201 A1* | 6/2017 | Wang | H02J 7/0047 |
| 2019/0149048 A1* | 5/2019 | Takegami | G05F 1/02 |
| | | | 323/282 |
| 2020/0209289 A1* | 7/2020 | Okuda | G01R 19/257 |

FOREIGN PATENT DOCUMENTS

| | | |
|---|---|---|
| JP | 2009-55656 A | 3/2009 |
| JP | 2015-99412 A | 5/2015 |
| JP | 2015-180061 A | 10/2015 |
| JP | 201717642 A | 1/2017 |
| JP | 201832086 A | 3/2018 |

* cited by examiner

FIG. 4A

| OPERATION SWITCH | INPUT VOLTAGE TO DIGITAL SIGNAL GENERATION UNIT (OUTPUT VOLTAGE OF OPERATION SWITCH) | OUTPUT VOLTAGE OF VOLTAGE SWITCHING UNIT (VOLTAGE AT $P_2$) | DIGITAL SIGNAL |
|---|---|---|---|
| CLOSED | 0V | 24V | ON |
| OPEN | $\frac{R_2}{R_1+R_2} \times 24V$ | | OFF |

FIG. 4B

| OPERATION SWITCH | INPUT VOLTAGE TO DIGITAL SIGNAL GENERATION UNIT (OUTPUT VOLTAGE OF OPERATION SWITCH) | OUTPUT VOLTAGE OF VOLTAGE SWITCHING UNIT (VOLTAGE AT $P_2$) | DIGITAL SIGNAL |
|---|---|---|---|
| CLOSED | 0V | ~~24V~~ ⇒ 0V | ~~ON~~ ⇔ OFF |
| OPEN | ~~$\frac{R_2}{R_1+R_2} \times 24V$~~ ⇒ 0V | ~~24V~~ ⇒ 0V | OFF |

FIG. 6A

| OPERATION SWITCH | INPUT VOLTAGE TO DIGITAL SIGNAL GENERATION UNIT (OUTPUT VOLTAGE OF OPERATION SWITCH) | DIGITAL SIGNAL |
|---|---|---|
| CLOSED | 0V | ON |
| OPEN | $\dfrac{R_2}{R_1+R_2} \times 24V$ | OFF |

FIG. 6B

| OPERATION SWITCH | INPUT VOLTAGE TO DIGITAL SIGNAL GENERATION UNIT (OUTPUT VOLTAGE OF OPERATION SWITCH) | DIGITAL SIGNAL |
|---|---|---|
| CLOSED | 0V | ON |
| OPEN | $\cancel{\dfrac{R_2}{R_1+R_2} \times 24V} \Rightarrow 0V$ | $\cancel{OFF} \Rightarrow ON$ |

FIG. 9A

| OPERATION SWITCH | INPUT VOLTAGE TO DIGITAL SIGNAL GENERATION UNIT (OUTPUT VOLTAGE OF OPERATION SWITCH) | OUTPUT VOLTAGE OF VOLTAGE SWITCHING UNIT(VOLTAGE AT $P_2$) | DIGITAL SIGNAL |
|---|---|---|---|
| CLOSED | 24V | 0V | ON |
| OPEN | 0V | | OFF |

FIG. 9B

| OPERATION SWITCH | INPUT VOLTAGE TO DIGITAL SIGNAL GENERATION UNIT (OUTPUT VOLTAGE OF OPERATION SWITCH) | OUTPUT VOLTAGE OF VOLTAGE SWITCHING UNIT(VOLTAGE AT $P_2$) | DIGITAL SIGNAL |
|---|---|---|---|
| CLOSED | 24V | $\cancel{0V} \Rightarrow \frac{R_3}{R_1+R_3} \times 24V$ | $\cancel{ON} \Rightarrow$ OFF |
| OPEN | 0V | 0V | OFF |

DIGITAL SIGNAL OUTPUT DEVICE THAT OUTPUTS A DIGITAL SIGNAL IN ACCORDANCE WITH OPERATION SWITCH

RELATED APPLICATIONS

The present application claims priority to Japanese Application Number 2019-049846, filed Mar. 18, 2019, the disclosure of which is hereby incorporated by reference herein in its entirety.

BACKGROUND OF THE INVENTION

1. Field of the Invention

The present invention relates to a digital signal output device that outputs a digital signal in accordance with an operation switch.

2. Description of the Related Art

There are digital signal output devices that output a digital signal in accordance with an operation switch provided for a machine tool or a robot, functioning as an interface for converting the state of operation of the operation switch into a digital signal that can be processed by the control apparatus that controls the machine tool or the robot. Such a digital signal is also referred to as, for example, a digital input signal or a DI signal. Control apparatuses that control a machine tool or a robot include, for example, a numerical control apparatus that controls a machine tool and a robot controller that controls a robot.

A digital signal output device outputs an ON digital signal (high or 1) when the contacts of the operation switch are closed and outputs an OFF digital signal (low or 0) when the contacts of the operation switch are open. The control apparatus that controls a machine tool or a robot senses the state of operation (open or closed state) of the operation switch, based on the ON or OFF digital signal outputted by the digital signal output device, and can execute various processes in accordance with the state.

In a digital signal output device, a common voltage, which is common to the machine tool, robot, or the control apparatus thereof, is applied to the "common terminal", which is one end of the operation switch. When the contacts of the operation switch are closed, a voltage equal to the common voltage is outputted from the "output terminal", which is the other end of the operation switch. When the contacts of the operation switch are open, a voltage different from the voltage equal to the common voltage is outputted from the output terminal of the operation switch. A digital signal output device generates and outputs ON and OFF digital signals in accordance with the voltages outputted from the output terminal of the operation switch. In order to generate ON and OFF digital signals properly according to such an operation principle, voltages of different values are preferably outputted from the output terminal of the operation switch in accordance with whether the contacts of the operation switch are open or closed. To achieve this, a voltage different from the common voltage is applied to the output terminal of the operation switch via a resistor (pull-up resistor or pull-down resistor).

For example, as described in Japanese Unexamined Patent Publication No. 2015-180061, there is known an electronic circuit including: a first input terminal and a second input terminal; an input circuit including a first input and a second input; a plurality of input switches controlled by one or more clock signals, wherein the plurality of input switches includes a first input switch electrically connected between the first input terminal and the first input of the input circuit and a second input switch electrically connected between the second input terminal and the second input of the input circuit; and a charge compensation circuit including a first output and a second output, wherein the charge compensation circuit is configured to compensate for charge injected by the plurality of input switches associated with at least one transition of the one or more clock signals.

For example, as described in Japanese Unexamined Patent Publication No. 2015-099412, there is known a digital output apparatus including an operation device and a detecting device, wherein the operation device includes a plurality of digital circuits that outputs digital signals and the detecting device determines with a logic circuit whether or not the logical value of the target signal to be detected among the digital signals corresponds to a predefined condition and, when the logical value corresponds to the condition, determines that the target signal is improper.

For example, as described in Japanese Unexamined Patent Publication No. 2009-055656, there is known an inverter device to which digital signals can be inputted in a source input form or a sink input form, the digital signals being in accordance with the open or closed state of switching means connected to the outside, the inverter device including: input terminals to which the switching means are respectively connected, each of the switching means connected to the corresponding input terminal at one end of the switching means; a common terminal to which the other ends of the switching means are commonly connected; a first switching means that connects the common terminal to one of a first common voltage adapted to the source input form and a second common voltage adapted to the sink input form; a first input circuit to which digital signals in the source input form are inputted and a second input circuit to which digital signals in the sink input form are inputted, the first input circuit and the second input circuit provided for each of the input terminal; and a second switching means interlocked with the first switching means, wherein the second switching means connects the input terminals to one of the first input circuit and the second input circuit in accordance with the input form.

For example, as described in Japanese Unexamined Patent Publication (Kokai) No. H11(1999)-161391, there is known an interface circuit including an input terminal for taking in an input signal such as a contact input and logic, characterized in that the interface circuit includes: a switching means for switching between a connection state in which the input terminal is connected to a pull-up resistor and a connection state in which the input terminal is connected to a pull-down resistor; a discrimination means for discriminating between a sink input and a source input by discriminating between the connection states switched by the switching means; and a signal switching means for switching between a signal output state in which an inverted signal of the input signal is outputted and a signal output state in which the input signal is outputted as is, based on a result of discrimination by the discrimination means.

SUMMARY OF INVENTION

Generally, machines such as a machine tool, a robot, or a control apparatus thereof have common voltages respectively set for them. In other words, different machines have different common voltages and, for example, some machines have a common voltage of 0 [V] and other machines have a common voltage of 24 [V]. Therefore, in order to be more versatile and be adaptable to multiple common voltages, a digital signal output device has a switching switch for selectively applying multiple voltages to the output terminal of the operation switch via a resistor (a pull-up resistor or a pull-down resistor). For example, in order to generate ON and OFF digital signals properly regardless of whether the operation switch is provided for a machine having a common voltage of 0 [V] or for a machine having a common voltage of 24 [V], a digital signal output device has a switching switch for selecting a voltage of 24 [V] or 0 [V]. The designer or operator of a machine such as a machine tool, a robot or the control apparatus thereof sets the switching switch to 24 [V] when the machine for which the operation switch is provided has a common voltage of 0 [V], and sets the switching switch to 0 [V] when the machine for which the operation switch is provided has a common voltage of 24 [V]. However, when an abnormality occurs with the switching switch, for example, an imperfect contact due to rusting or a presence of a foreign material and a misalignment of switching positions due to a vibration of the machine or a shock thereon, it is no longer possible to apply a voltage different from the common voltage to the output terminal of the operation switch via a resistor. As a result, the digital signal output device will malfunction and fail to generate ON and OFF digital signals properly. When an abnormality occurs in the switching switch in the digital signal output device, the machine tool or robot may make a movement that is different from the normal movement thereof and hazardous. Therefore, there is a desire for a safety technique that prevents hazard associated with a machine for which an operation switch is provided when an abnormality occurs in a digital signal output device that outputs digital signals in accordance with the operation switch.

According to one aspect of the present disclosure, a digital signal output device includes: an operation switch including contacts, a first terminal to which a first voltage is applied, and a second terminal from which the first voltage is outputted when the contacts are closed; a voltage switching unit configured to select a second voltage different from the first voltage from among a plurality of constant voltages and outputs the second voltage; a voltage determination unit configured to determine on a designated cycle whether or not a voltage outputted from the voltage switching unit has changed from the second voltage; and a digital signal generation unit configured to, when the voltage determination unit determine that the voltage outputted from the voltage switching unit has not changed from the second voltage, generates on every cycle a digital signal indicating a first state when the first voltage is outputted from the second terminal and a digital signal indicating a second state different from the first state when the first voltage is not outputted from the second terminal.

BRIEF DESCRIPTION OF THE DRAWINGS

The present invention will be more clearly understood with reference to the following accompanying drawings:

FIG. 4A is a diagram illustrating the relation between the open and the closed states of the operation switch and the digital signals outputted from the digital signal generation unit in the digital signal output device of FIG. 2, with no abnormality in the switching switch in the voltage switching unit;

FIG. 4B is a diagram illustrating the relation between the open and the closed states of the operation switch and the digital signals outputted from the digital signal generation unit in the digital signal output device of FIG. 2, with an abnormality in the switching switch in the voltage switching unit;

FIG. 6A is a diagram illustrating the relation between the open and the closed states of the operation switch and the digital signals outputted from the digital signal generation unit in the conventional digital signal output device of FIG. 5A and FIG. 5B, with no abnormality in the switching switch in the voltage switching unit;

FIG. 6B is a diagram illustrating the relation between the open and the closed states of the operation switch and the digital signals outputted from the digital signal generation unit in the conventional digital signal output device of FIG. 5A and FIG. 5B, with an abnormality in the switching switch in the voltage switching unit;

FIG. 9A is a diagram illustrating the relation between the open and the closed states of the operation switch and the digital signals outputted from the digital signal generation unit in the digital signal output device of FIG. 7, with no abnormality in the switching switch in the voltage switching unit;

FIG. 9B is a diagram illustrating the relation between the open and the closed states of the operation switch and the digital signals outputted from the digital signal generation unit in the digital signal output device of FIG. 7, with an abnormality in the switching switch in the voltage switching unit;

DETAILED DESCRIPTION

Figure 1:
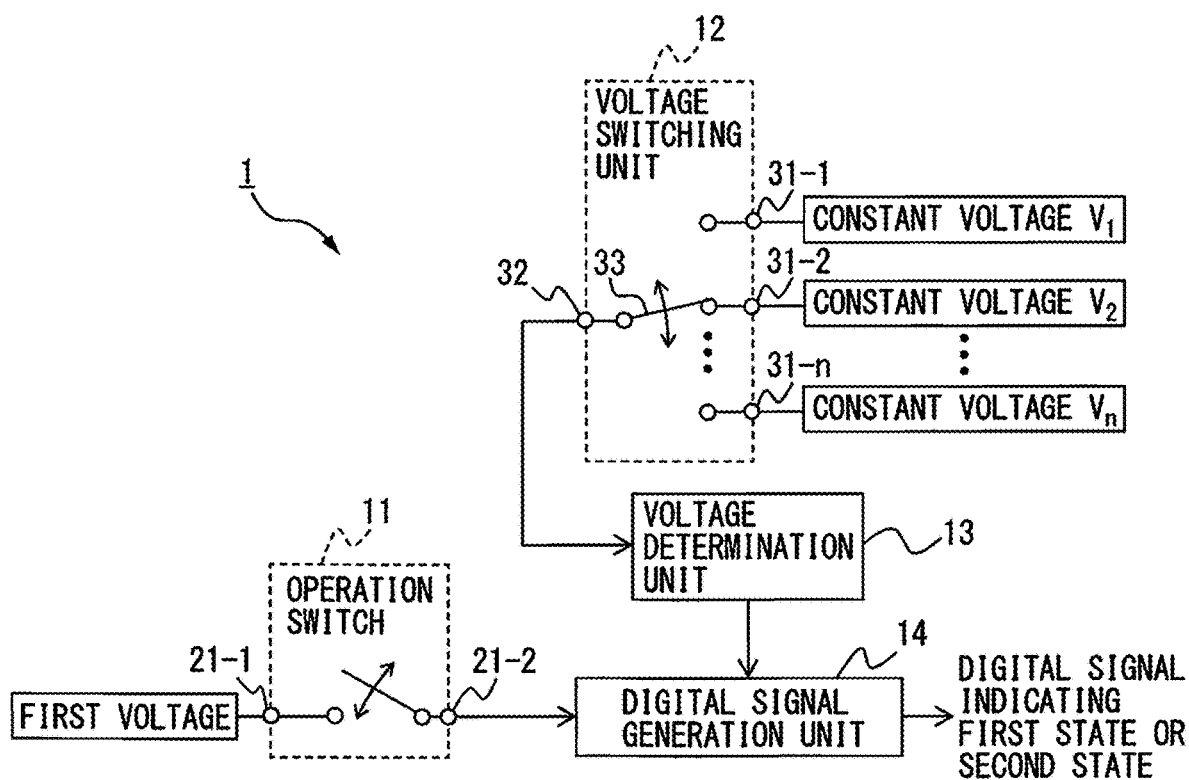
FIG. 1 is a schematic diagram illustrating a configuration of a digital signal output device according to one embodiment of the present disclosure.

A digital signal output device that outputs digital signals in accordance with an operation switch will be described below with reference to the attached drawings. The scales of the drawings vary as appropriate for easier understanding. The items illustrated in the drawings are examples in embodiment and may take other forms than the illustrated embodiments.

First, a configuration of a digital signal output device according to one embodiment of the present disclosure will be described. FIG. 1 is a schematic diagram illustrating a configuration of a digital signal output device according to one embodiment of the present disclosure.

The digital signal output device 1 includes an operation switch 11, a voltage switching unit 12, a voltage determination unit 13, and a digital signal generation unit 14.

The digital signal indicating a first state and the digital signal indicating a second state to be described below are ON and OFF digital signals. In other words, one of the digital signal indicating the first state and the digital signal indicating the second state is an ON signal (high or 1) and the other is an OFF signal (low or 0). Preferably, the digital signal indicating the first state is an ON signal (high or 1) and the digital signal indicating the second state is an OFF signal (low or 0).

The operation switch 11 includes a first terminal 21-1 and a second terminal 21-2. The operation switch 11 is, for example, a mechanical switch. The first terminal is a common terminal and a common voltage, which is a first voltage, and is applied to the first terminal. The second terminal is connected to the digital signal generation unit 14. When the contacts are closed by an operator operating the operation switch 11, a conductive path is formed between the first terminal 21-1 and the second terminal 21-2 and the common voltage, which is the first voltage, is outputted from the second terminal 21-2.

The voltage switching unit 12 has a voltage selection function for selecting a second voltage different from the first voltage from among constant voltages and outputting the second voltage. The voltage switching unit 12 includes a plurality of input terminals 31-1, 31-2, . . . , 31-$n$ (wherein n is a natural number), an output terminal 32, and a switching switch 33.

Constant voltages $V_1$, $V_2$, . . . , $V_n$, which are different from each other, are applied respectively to the input terminals 31-1, 31-2, . . . , 31-$n$. The constant voltages $V_1$, $V_2$, . . . , $V_n$ include a candidate for a second voltage, which is different from the common voltage, which is the first voltage.

The switching switch 33 selectively switches among the plurality of input terminals 31-1, 31-2, . . . , 31-$n$ for electric connection with the output terminal 32. When the operator operates the switching switch 33, one of the plurality of input terminals 31-1, 31-2, . . . , 31-$n$ is selected for electrical connection with the output terminal 32 and a constant voltage applied to the selected input terminal is thereby outputted from the output terminal 32. As describe above, the constant voltages $V_1$, $V_2$, . . . , $V_n$ applied to the input terminals 31-1, 31-2, . . . , 31-$n$ includes a candidate for a second voltage, which is different from the common voltage, which is the first voltage. Since it is preferable that a second voltage different from the common voltage be outputted from the output terminal 32, an input terminal to which a second voltage is applied is selected for the connection with the output terminal 32.

The voltage determination unit 13 periodically monitors the voltage outputted from the output terminal 32 of the voltage switching unit 12. The voltage determination unit 13 monitors the voltage on a cycle of, for example, several milliseconds. The voltage determination unit 13 determines whether or not the voltage outputted from the output terminal 32 of the voltage switching unit 12 has changed from the second voltage on such a cycle. The result of the determination by the voltage determination unit 13 is communicated to the digital signal generation unit 14.

As described above, in the switching switch 33 in the voltage switching unit 12, an input terminal to which a second voltage different from the common voltage is applied is selected for connection with the output terminal 32; thus when there is no abnormality in the switching switch 33, the voltage determination unit 13 detects the second voltage being outputted from the output terminal 32 of the voltage switching unit 12 on every cycle. However, when an abnormality subsequently occurs with the switching switch 33 in the voltage switching unit 12, for example, an imperfect contact due to rusting or a presence of a foreign material and a misalignment of switching positions due to a vibration of the machine or a shock thereon, the output terminal 32 of the voltage switching unit 12 stops outputting the second voltage at the moment of the occurrence of the abnormality. In other words, when the voltage determination unit 13 detects a change in the voltage outputted from the output terminal 32 of the voltage switching unit 12 from the second voltage, this indicates an occurrence of an abnormality in the switching switch 33 in the voltage switching unit 12. The voltage determination unit 13 determines whether or not the voltage outputted from the output terminal 32 of the voltage switching unit 12 has changed from the second voltage on every designated cycle and communicates the result of the determination to the digital signal generation unit 14.

The digital signal generation unit 14 generates and outputs one of a digital signal indicating the first state and a digital signal indicating the second state, which is different from the first state, based on the voltage outputted from the second terminal of the operation switch 11 and the result of the determination by the voltage determination unit 13. This will be described more in detail below. The processes of generation and output of a digital signal by the digital signal generation unit 14 are executed on every designated cycle.

In a case in which the voltage determination unit 13 has determined that the voltage outputted from the output terminal 32 of the voltage switching unit 12 has not changed from the second voltage, the digital signal generation unit 14 generates and outputs a digital signal indicating the first state when the common voltage (first voltage) is outputted from the second terminal 21-2 of the operation switch 11. In this case, there is no abnormality in the switching switch 33 since the voltage outputted from the output terminal 32 of the voltage switching unit 12 has not changed from the second voltage and, furthermore, the contacts of the operation switch 11 are closed, forming a conductive path between the first terminal 21-1 and the second terminal 21-2, and the common voltage, which is the first voltage, applied to the first terminal 21-1 is outputted from the second terminal 21-2. Thus, when there is no abnormality in the switching switch 33 in the voltage switching unit 12, the digital signal output device 1 outputs a digital signal indicating the first state in accordance with the closed state of the contacts of the operation switch 11. Since the processes of generation and output of the digital signals by the digital signal generation unit 14 are executed on every designated cycle, the digital signal output device 1 continues to output a digital signal indicating the first state when the contacts of the operation switch 11 remain closed as long as there is no abnormality in the switching switch 33 in the voltage switching unit 12.

In a case in which the voltage determination unit 13 has determined that the voltage outputted from the output terminal 32 of the voltage switching unit 12 has not changed from the second voltage, the digital signal generation unit 14 generates and outputs a digital signal indicating the second state when the common voltage (first voltage) is not outputted from the second terminal 21-2 of the of the operation switch 11. In this case, there is no abnormality in the switching switch 33 since the voltage outputted from the output terminal 32 of the voltage switching unit 12 has not changed from the second voltage and, furthermore, the contacts of the operation switch 11 are open, forming no conductive path between the first terminal 21-1 and the second terminal 21-2, and the common voltage, which is the first voltage, applied to the first terminal 21-1 is not outputted from the second terminal 21-2. Thus, when there is no abnormality in the switching switch 33 in the voltage switching unit 12, the digital signal output device 1 outputs a digital signal indicating the second state in accordance with the open state of the contacts of the operation switch 11. Since the processes of generation and output of the digital signals by the digital signal generation unit 14 are executed on every designated cycle, the digital signal output device 1 continues to output a digital signal indicating the second state when the contacts of the operation switch 11 remain open as long as there is no abnormality in the switching switch 33 in the voltage switching unit 12.

In a case in which the voltage determination unit 13 has determined that the voltage outputted from the output terminal 32 of the voltage switching unit 12 has changed from the second voltage, the digital signal generation unit 14 generates and outputs a digital signal indicating the second state. In this case, the change in the voltage outputted from the output terminal 32 of the voltage switching unit 12 from the second voltage indicates an occurrence of an abnormality in the switching switch 33 at the moment of the change. Thus, when an abnormality has occurred in the switching switch 33 in the voltage switching unit 12, the digital signal output device 1 outputs a digital signal indicating the second state regardless of whether the contacts of the operation switch 11 are open or closed. Since the processes of generation and output of the digital signals by the digital signal generation unit 14 are executed on every designated cycle, when an abnormality subsequently occurred in the switching switch 33 in the voltage switching unit 12, the digital signal output device 1 continues to output a digital signal indicating the second state from the moment of the occurrence of the abnormality.

Thus, according to the present embodiment, when there is no abnormality in the switching switch 33 in the voltage switching unit 12, the digital signal output device 1 outputs a digital signal indicating the first state in accordance with the closed state of the contacts of the operation switch 11 and outputs a digital signal indicating the second state in accordance with the open state of the contacts of the operation switch 11. Further, when an abnormality has occurred in the switching switch 33 in the voltage switching unit 12, the digital signal output device 1 outputs a digital signal indicating the second state.

The digital signal output device 1 is configured to output a digital signal indicating the second state when an abnormality has occurred in the switching switch 33 in the voltage switching unit 12, like when there is no abnormality in the switching switch 33 in the voltage switching unit 12 and the contacts of the operation switch 11 are open, for the following reason. Generally, an operation switch is operated to close the contacts when it is intended to cause the machine tool or robot for which the operation switch is provided to make some movement, and when the operation switch is not operated and the contacts are open, the machine tool or robot remains inactive. Hence, the digital signal output device 1 according to the present embodiment outputs a digital signal indicating the second state when an abnormality has occurred in the switching switch 33 in the voltage switching unit 12, like when the contacts of the operation switch 11 are open, to stop the machine tool or robot, like when the operation switch 11 is not operated and the contacts are open. This prevents hazard associated with the machine for which the operation switch 11 is provided even when an abnormality occurs in the switching switch 33 in the voltage switching unit 12.

Next, some application examples of the digital signal output device 1 according to the present embodiment will be enumerated. As examples, the case with a common voltage of 0 [V] and the case with a common voltage of 24 [V] will be described herein, but the presented values of the common voltage are merely for illustration and the common voltage may take other values. Further, in the examples described below, the digital signal indicating the first state is an ON signal (high or 1) and the digital signal indicating the second state is an OFF signal (low or 0) as an example. The description below stands applicable even when the digital signal indicating the first state is an OFF signal (low or 0) and the digital signal indicating the second state is an ON signal (high or 1).

Figure 2:
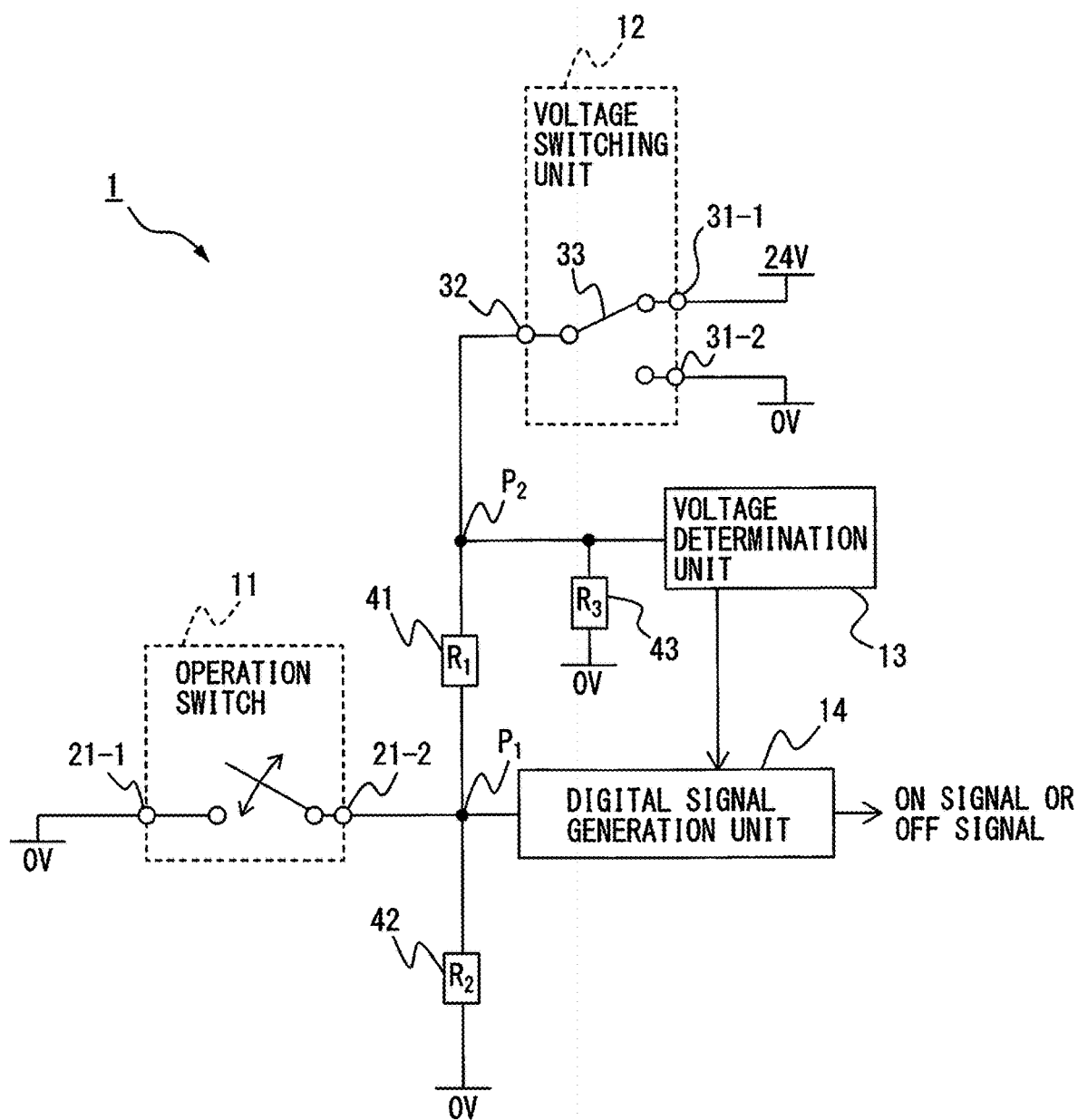
FIG. 2 is a diagram illustrating a configuration of the digital signal output device according to one embodiment of the present disclosure applied to a case in which the common voltage is 0 [V]
Figure 3:
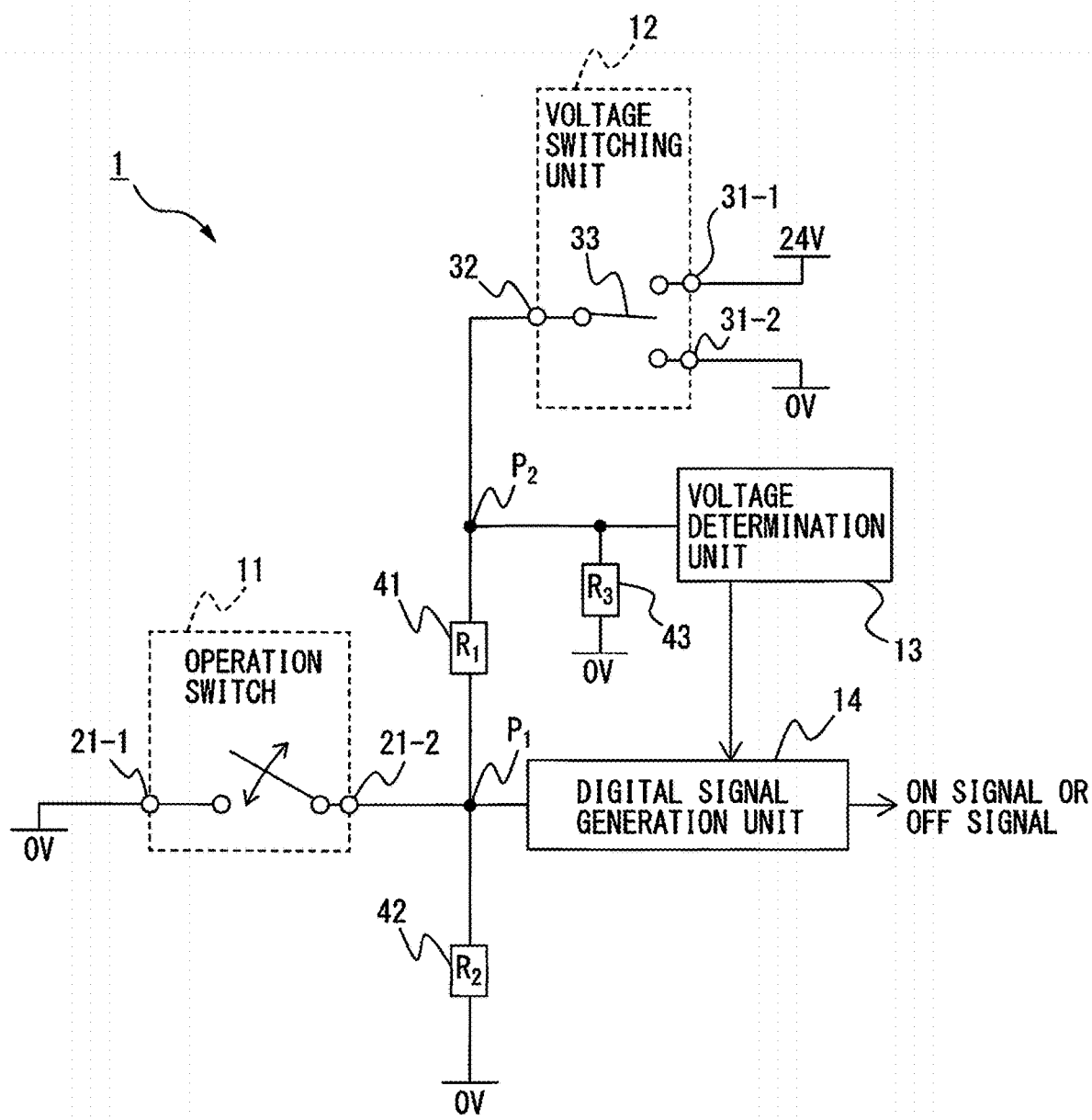
FIG. 3 is a diagram illustrating a case with an abnormality occurring in the voltage switching unit in the digital signal output device of FIG. 2.

FIG. 2 is a diagram illustrating a configuration of the digital signal output device according to one embodiment of the present disclosure applied to a case in which the common voltage is 0 [V]. FIG. 3 is a diagram illustrating a case with an abnormality occurring in the voltage switching unit in the digital signal output device of FIG. 2. FIG. 4A is a diagram illustrating the relation between the open and the closed states of the operation switch and the digital signals outputted from the digital signal generation unit in the digital signal output device of FIG. 2, with no abnormality in the switching switch in the voltage switching unit. FIG. 4B is a diagram illustrating the relation between the open and the closed states of the operation switch and the digital signals outputted from the digital signal generation unit in the digital signal output device of FIG. 2, with an abnormality in the switching switch in the voltage switching unit.

In the example illustrated in FIG. 2 and FIG. 3, the digital signal output device 1 has, as an example, a configuration in which voltages of, for example, 24 [V] and 0 [V] are respectively applied to the input terminals 31-1 and 31-2 of the voltage switching unit 12 in order to be more versatile and be adaptable to multiple common voltages. The common voltage of 0 [V] is applied to the first terminal 21-1, which is the common terminal, of the operation switch 11. Hence the operator operates the switching switch 33 to select the input terminal 31-1 for connection with the output terminal 32 so that a voltage of 24 [V], which is different from the common voltage, may be outputted from the output terminal 32 of the voltage switching unit 12. A voltage of 24 [V] is thereby outputted from the output terminal 32 of the voltage switching unit 12.

The second terminal 21-2 of the operation switch 11 is connected to the digital signal generation unit 14 via the point $P_1$. A resistor 42 is connected to the point $P_1$, while the opposite end of the resistor 42 to the point $P_1$ is grounded. The output terminal 32 of the voltage switching unit 12 is connected to a resistor 41 via the point $P_2$. The opposite end of the resistor 41 to the point $P_2$ is connected to the point $P_1$. Further, a resistor 43 and the voltage determination unit 13 are connected to the point $P_2$. The opposite end of the resistor 43 to the point $P_2$ is grounded. Let the resistance of the resistor 41 be $R_1[\Omega]$, the resistance of the resistor 42 be $R_2[\Omega]$, and the resistance of the resistor 43 be $R_3[\Omega]$.

As illustrated in FIG. 2 and FIG. 4A, when there is no abnormality in the switching switch 33 in the voltage switching unit 12, the switching switch 33 electrically connects the output terminal 32 with the input terminal 31-1, and a second voltage of 24 [V], which is different from the common voltage (first voltage), is outputted from the output terminal 32 of the voltage switching unit 12. The voltage determination unit 13, which periodically monitors the voltage outputted from the output terminal 32 of the voltage switching unit 12, continues to detect a voltage of 24 [V] regardless of whether the operation switch 11 is open or closed, and determines that the voltage outputted from the output terminal 32 of the voltage switching unit 12 has not changed from 24 [V].

As illustrated in FIG. 2 and FIG. 4A, when there is no abnormality in the switching switch 33 in the voltage switching unit 12 and the contacts of the operation switch 11 are closed, a conductive path is formed between the first terminal 21-1 and the second terminal 21-2 and a voltage of 0 [V], which is the common voltage (first voltage) applied to the first terminal 21-1, is outputted from the second terminal 21-2. As a result, the digital signal generation unit 14 generates and outputs an ON signal, which is a digital signal indicating the first state. Further, as illustrated in FIG. 2 and FIG. 4A, when there is no abnormality in the switching switch 33 in the voltage switching unit 12 and the contacts of the operation switch 11 are open, no conductive path is formed between the first terminal 21-1 and the second terminal 21-2. Since a voltage of 24 [V] is outputted from the output terminal of the voltage switching unit 12, a voltage of $24 \times R_2/(R_1+R_2)$ [V] appears at the point $P_1$, and this voltage is inputted to the digital signal generation unit 14. This voltage of $24 \times R_2/(R_1+R_2)$ [V] is different from the common voltage of 0 [V]. As a result, the digital signal generation unit 14 generates and outputs an OFF signal, which is a digital signal indicating the second state.

As illustrated in FIG. 3 and FIG. 4B, when an abnormality occurs in the switching switch 33 in the voltage switching unit 12, the output terminal 32 is not electrically connected to the input terminal 31-1. Hence the second voltage of 24 [V] is not outputted from the output terminal 32 of the voltage switching unit 12 from the moment of the occurrence of the abnormality and a voltage of 0 [V], which is the voltage on the grounded side of the resistor 42, appears at the point $P_2$. The voltage determination unit 13, which periodically monitors the voltage outputted from the output terminal 32 of the voltage switching unit 12, detects a voltage of 0 [V] instead of 24 [V] from the moment of the occurrence of the abnormality regardless of whether the operation switch 11 is open or closed. Therefore, the voltage determination unit 13 determines that the voltage outputted from the output terminal 32 of the voltage switching unit 12 has changed from 24 [V] to 0 [V]. As a result, the digital signal output device 1 outputs an OFF signal, which is a digital signal indicating the second state, regardless of whether the contacts of the operation switch 11 are open or closed. Note that, when there is an abnormality occurring in the switching switch 33 in the voltage switching unit 12, a voltage of 0 [V] is inputted to the digital signal generation unit 14 since a voltage of 0 [V], which is the voltage on the ground side of the resistor 42, appears at the point $P_1$, but that the input of the voltage of 0 [V] to the digital signal generation unit 14 does not particularly affect the digital signal output device 1 since the digital signal output device 1 outputs the OFF signal based on, in the first place, the determination of a change from 24 [V] to 0 [V] in the voltage outputted from the output terminal 32 of the voltage switching unit 12.

Figure 5A:
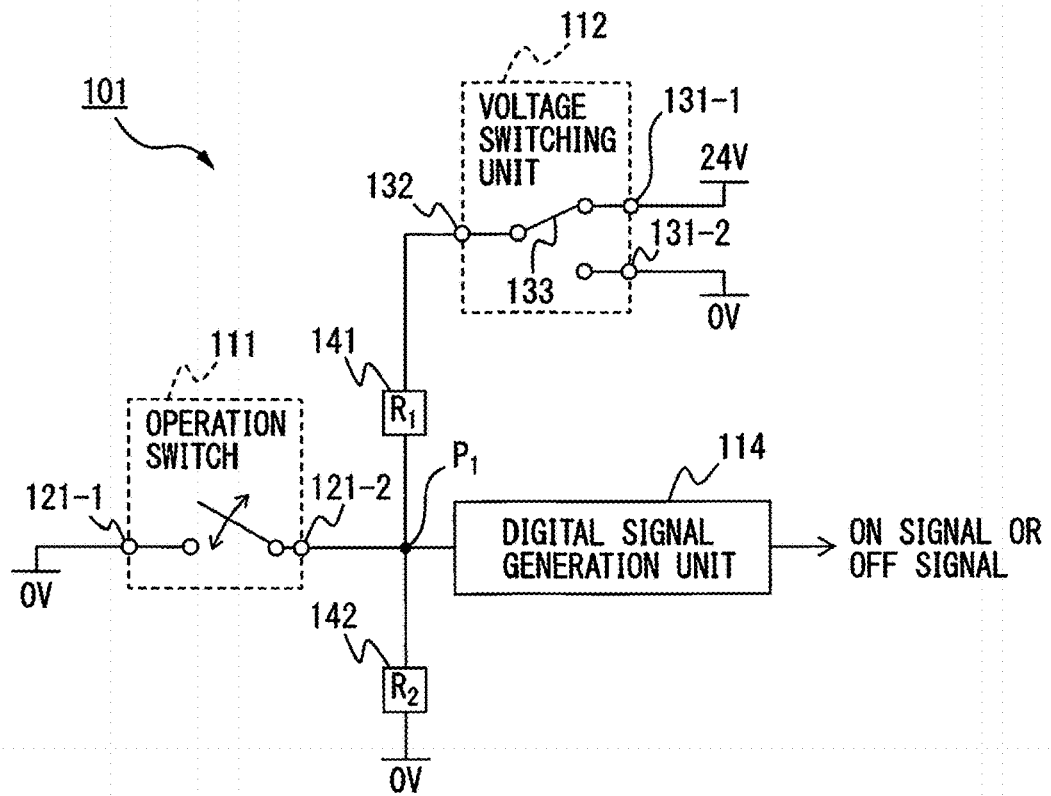
FIG. 5A is a diagram illustrating a configuration of a conventional digital signal output device applied to a case in which the common voltage is 0 [V], with no abnormality in the switching switch in the voltage switching unit.
Figure 5B:
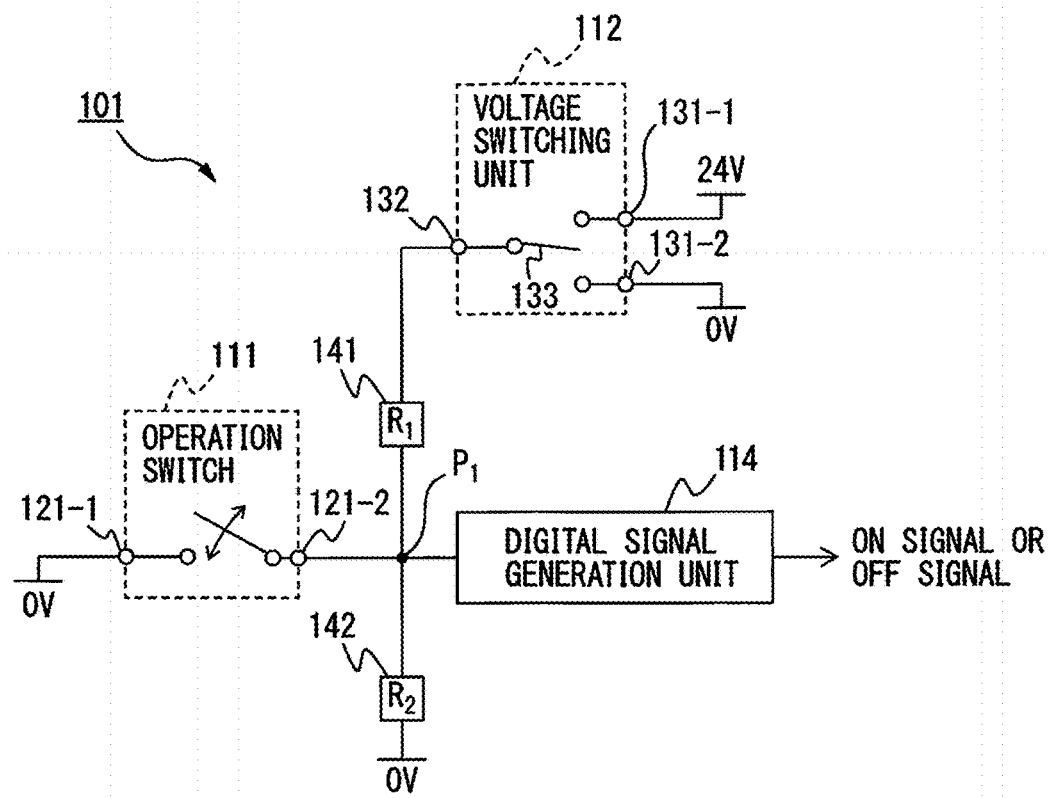
FIG. 5B is a diagram illustrating a configuration of a conventional digital signal output device applied to a case in which the common voltage is 0 [V], with an abnormality in the switching switch in the voltage switching unit.

FIG. 5A is a diagram illustrating a configuration of a conventional digital signal output device applied to a case in which the common voltage is 0 [V], with no abnormality in the switching switch in the voltage switching unit. FIG. 5B is a diagram illustrating a configuration of a conventional digital signal output device applied to a case in which the common voltage is 0 [V], with an abnormality in the switching switch in the voltage switching unit. FIG. 6A is a diagram illustrating the relation between the open and the closed states of the operation switch and the digital signals outputted from the digital signal generation unit in the conventional digital signal output device of FIG. 5A and FIG. 5B, with no abnormality in the switching switch in the voltage switching unit. FIG. 6B is a diagram illustrating the relation between the open and the closed states of the operation switch and the digital signals outputted from the digital signal generation unit in the conventional digital signal output device of FIG. 5A and FIG. 5B, with an abnormality in the switching switch in the voltage switching unit.

In a conventional digital signal output device 101, the common voltage of 0 [V] is applied to the first terminal 121-1, which is the common terminal of the operation switch 111. Hence the operator operates the switching switch 133 to select the input terminal 131-1 for connection with the output terminal 132 so that a voltage of 24 [V], which is different from the common voltage, may be outputted from the output terminal 132 of the voltage switching unit 112. A voltage of 24 [V] is thereby outputted from the output terminal 132 of the voltage switching unit 112.

The second terminal 121-2 of the operation switch 111 is connected to the digital signal generation unit 114 via the point $P_1$. A resistor 142 is connected to the point $P_1$, while the opposite end of the resistor 142 to the point $P_1$ is grounded. The output terminal 132 of the voltage switching unit 112 is connected to a resistor 141 and the resistor 141 is further connected to the point $P_1$. Let the resistance of the resistor 141 be $R_1[\Omega]$ and the resistance of the resistor 142 be $R_2[\Omega]$. As illustrated in FIG. 5A and FIG. 6A, when there is no abnormality in the switching switch 133 in the voltage switching unit 112, the switching switch 133 electrically connects the output terminal 132 with the input terminal 131-1, and a second voltage of 24 [V], which is different from the common voltage (first voltage), is outputted from the output terminal 132 of the voltage switching unit 112.

As illustrated in FIG. 5A and FIG. 6A, when there is no abnormality in the switching switch 133 in the voltage switching unit 112 and the contacts of the operation switch 111 are closed, a conductive path is formed between the first terminal 121-1 and the second terminal 121-2 and a voltage of 0 [V], which is the common voltage (first voltage) applied to the first terminal 121-1, is outputted from the second terminal 121-2. As a result, the digital signal generation unit 114 generates and outputs an ON signal. When the contacts of the operation switch 111 are open, no conductive path is formed between the first terminal 121-1 and the second terminal 121-2. Since a voltage of 24 [V] is outputted from the output terminal 132 of the voltage switching unit 112, a voltage of $24 \times R_2/(R_1+R_2)$ [V] appears at the point $P_1$, and this voltage is inputted to the digital signal generation unit 14. This voltage of $24 \times R_2/(R_1+R_2)$ [V] is different from the common voltage of 0 [V]. As a result, the digital signal generation unit 14 generates and outputs an OFF signal.

As illustrated in FIG. 5B and FIG. 6B, when an abnormality occurs in the switching switch 133 in the voltage switching unit 112, the output terminal 132 is not electrically connected to the input terminal 131-1. Hence the voltage of 24 [V] is not outputted from the output terminal 132 of the voltage switching unit 112, and a voltage of 0 [V], which is the voltage on the grounded side of the resistor 142, appears at the point $P_1$. This voltage of 0 [V], which appears at the point $P_1$ is equal to the voltage that appears at the point $P_1$ when there is no abnormality in the switching switch 133 in the voltage switching unit 112 and the contacts of the operation switch 111 are closed. Therefore, when an abnormality occurs in the switching switch 133 in the voltage switching unit 112, the digital signal output device 1 generates and outputs an ON signal regardless of whether the contacts of the operation switch 111 are open or closed. In other words, the voltage that appears at the point $P_1$ when an abnormality occurs in the switching switch 133 in the voltage switching unit 112 is a voltage of 0 [V] instead of the voltage of $24 \times R_2/(R_1+R_2)$ [V], which appears when the contacts of the operation switch 111 are open. Therefore, although the digital signal output device 1 in the normal condition would generate an OFF signal in accordance with the voltage of $24 \times R_2/(R_1+R_2)$ [V], which would appear at the point $P_1$, the digital signal output device 1 ends up outputting an ON signal in accordance with the 0 [V] appearing at the point $P_1$.

As described above, in a case in which an abnormality occurs in the switching switch 133 in the voltage switching unit 112, the conventional digital signal output device 101 malfunctions as the digital signal output device 101 outputs an inverted signal, i.e., an ON signal instead of an OFF signal when the contacts of the operation switch 111 are open. When the conventional digital signal output device 101 malfunctions this way, the machine tool or robot to which the digital signal output device 101 is attached may make a movement that is different from the normal movement and hazardous. Generally, when the operation switch 111 is operated to close the contacts, the machine tool or robot makes some movement in accordance with the ON signal outputted by the digital signal output device 101 and, when the operation switch 111 is not operated and the contacts are open, the machine tool or robot remains stationary in accordance with the ON signal outputted by the digital signal output device 101 in most cases. However, in a case in which an abnormality has occurred in the switching switch 133 in the voltage switching unit 112, the conventional digital signal output device 101 outputs an ON signal instead of an OFF signal even when the operation switch 111 is not operated and the contacts are open as described above, and the machine tool or robot, which is supposed to remain stationary, makes a movement. Such an unintended movement of the machine tool or robot is very hazardous.

In contrast, the digital signal output device 1 according to the present embodiment outputs a digital signal indicating the second state in a case in which an abnormality has occurred in the switching switch 33 in the voltage switching unit 12, like when the contacts of the operation switch 11 are open, in order to stop the machine tool or robot like when the operation switch 11 is not operated and the contacts are open. This prevents hazard associated with the machine for which the operation switch 11 is provided even when an abnormality occurs in the switching switch 33 in the voltage switching unit 12.

Figure 7:
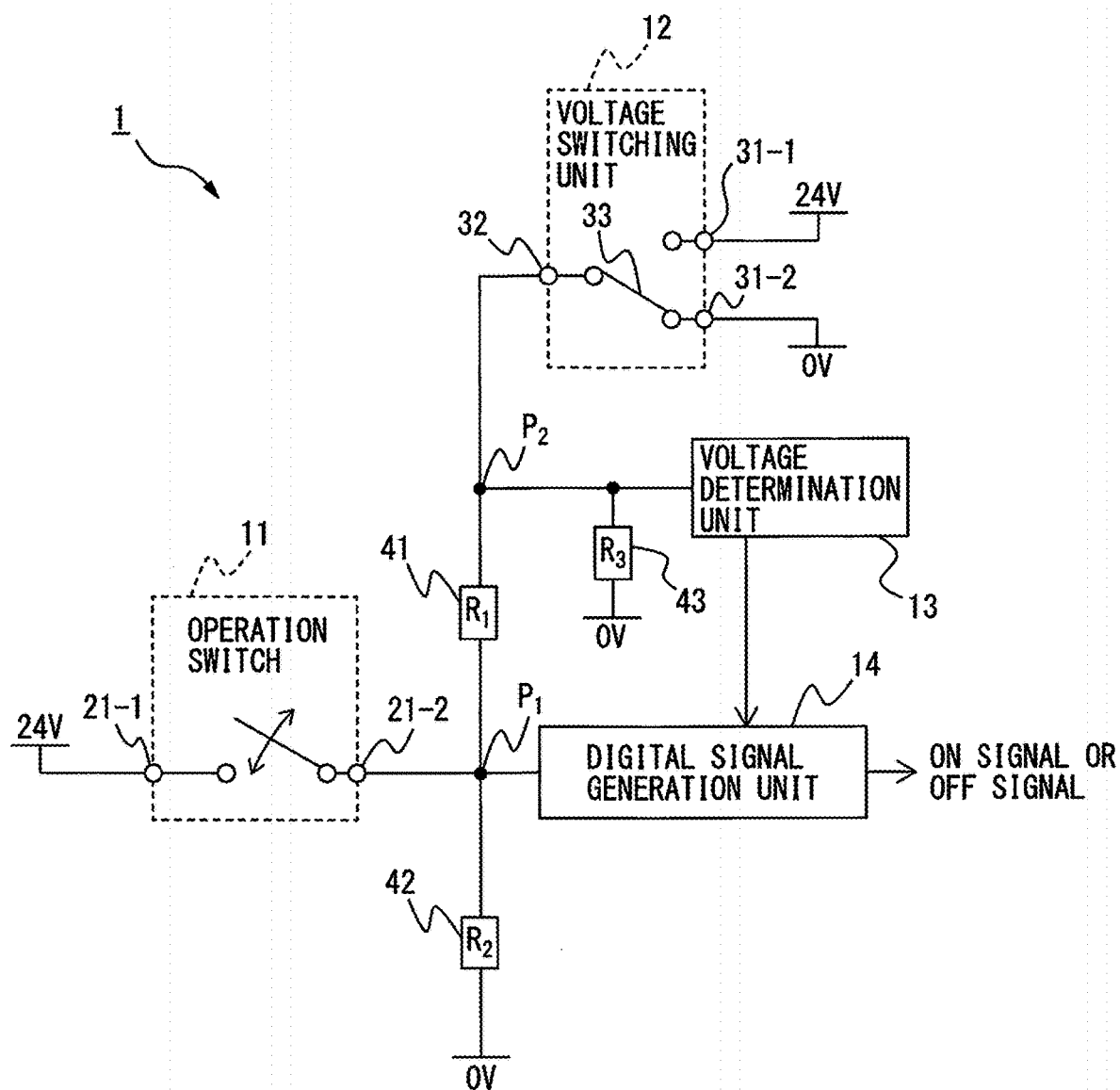
FIG. 7 is a diagram illustrating a configuration of the digital signal output device according to one embodiment of the present disclosure applied to a case in which the common voltage is 24 [V]
Figure 8:
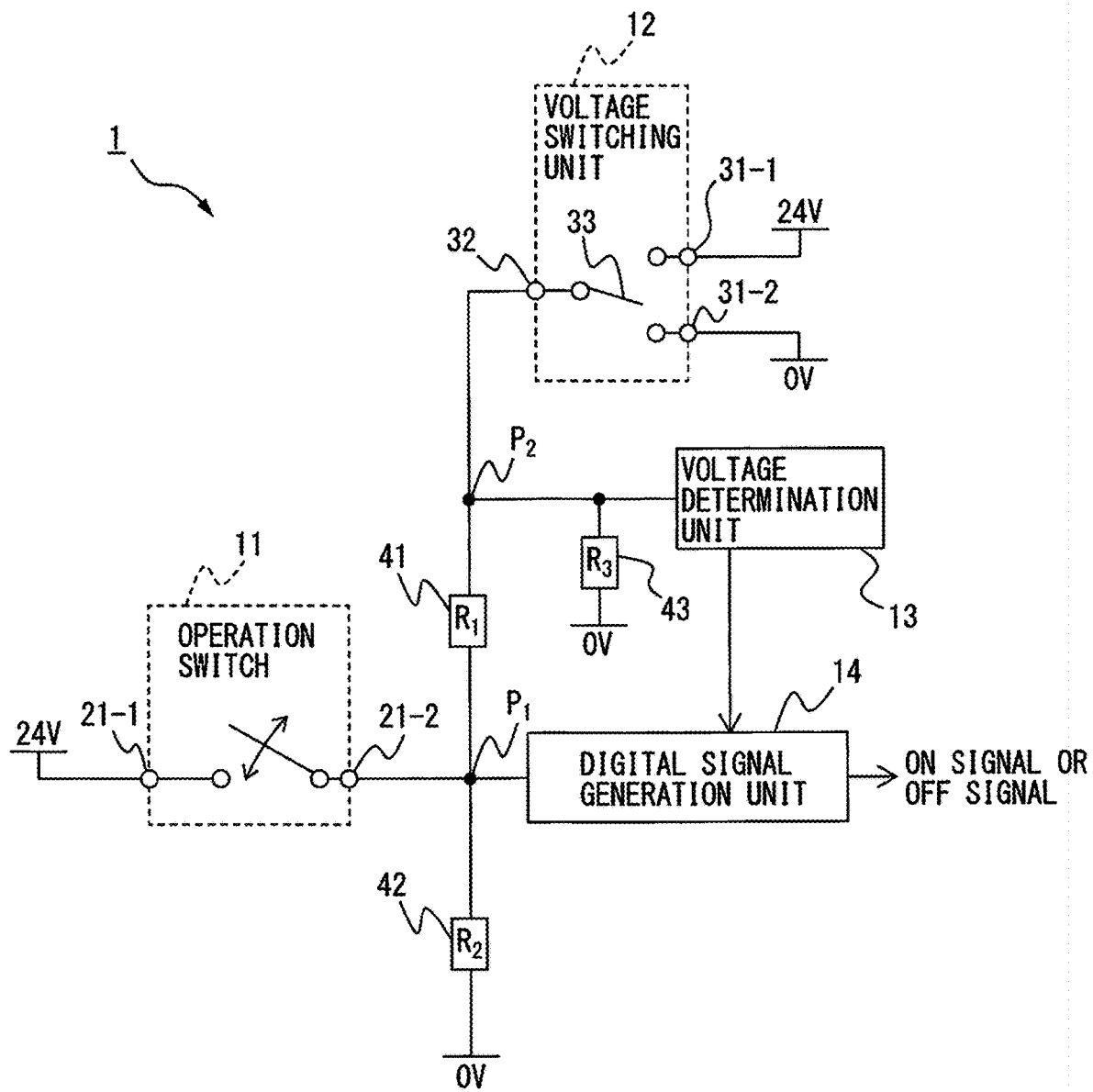
FIG. 8 is a diagram illustrating a case with an abnormality occurring in the voltage switching unit in the digital signal output device of FIG. 7.

FIG. 7 is a diagram illustrating a configuration of the digital signal output device according to one embodiment of the present disclosure applied to a case in which the common voltage is 24 [V]. FIG. 8 is a diagram illustrating a case with an abnormality occurring in the voltage switching unit in the digital signal output device of FIG. 7. FIG. 9A is a diagram illustrating the relation between the open and the closed states of the operation switch and the digital signals outputted from the digital signal generation unit in the digital signal output device of FIG. 7, with no abnormality in the switching switch in the voltage switching unit. FIG. 9B is a diagram illustrating the relation between the open and the closed states of the operation switch and the digital signals outputted from the digital signal generation unit in the digital signal output device of FIG. 7, with an abnormality in the switching switch in the voltage switching unit.

In the example illustrated in FIG. 7 and FIG. 8, the digital signal output device 1 has, as an example, a configuration in which voltages of, for example, 24 [V] and 0 [V] are respectively applied to the input terminals 31-1 and 31-2 of the voltage switching unit 12 in order to be more versatile and be adaptable to multiple common voltages. The common voltage of 24 [V] is applied to the first terminal 21-1, which is the common terminal, of the operation switch 11. Hence the operator operates the switching switch 33 to select the input terminal 31-2 for connection with the output terminal 32 so that a voltage of 0 [V], which is different from the common voltage, may be outputted from the output terminal 32 of the voltage switching unit 12. A voltage of 0 [V] is thereby outputted from the output terminal 32 of the voltage switching unit 12.

The second terminal 21-2 of the operation switch 11 is connected to the digital signal generation unit 14 via the point $P_1$. A resistor 42 is connected to the point $P_1$, while the opposite end of the resistor 42 to the point $P_1$ is grounded. The output terminal 32 of the voltage switching unit 12 is connected to a resistor 41 via the point $P_2$. The opposite end of the resistor 41 to the point $P_2$ is connected to the point $P_1$. Further, a resistor 43 and the voltage determination unit 13 are connected to the point $P_2$. The opposite end of the resistor 43 to the point $P_2$ is grounded. Let the resistance of the resistor 41 be $R_1[\Omega]$, the resistance of the resistor 42 be $R_2[\Omega]$, and the resistance of the resistor 43 be $R_3[\Omega]$.

As illustrated in FIG. 7 and FIG. 9A, when there is no abnormality in the switching switch 33 in the voltage switching unit 12, the switching switch 33 electrically connects the output terminal 32 with the input terminal 31-2, and a second voltage of 0 [V], which is different from the common voltage (first voltage), is outputted from the output terminal 32 of the voltage switching unit 12. The voltage determination unit 13, which periodically monitors the voltage outputted from the output terminal 32 of the voltage switching unit 12, continues to detect a voltage of 24 [V] regardless of whether the operation switch 11 is open or closed, and determines that the voltage outputted from the output terminal 32 of the voltage switching unit 12 has not changed from 0 [V].

As illustrated in FIG. 7 and FIG. 9A, when there is no abnormality in the switching switch 33 in the voltage switching unit 12 and the contacts of the operation switch 11 are closed, a conductive path is formed between the first terminal 21-1 and the second terminal 21-2 and a voltage of 24 [V], which is the common voltage (first voltage) applied to the first terminal 21-1, is outputted from the second terminal 21-2. As a result, the digital signal generation unit 14 generates and outputs an ON signal, which is a digital signal indicating the first state. Further, as illustrated in FIG. 7 and FIG. 9A, when there is no abnormality in the switching switch 33 in the voltage switching unit 12 and the contacts of the operation switch 11 are open, no conductive path is formed between the first terminal 21-1 and the second terminal 21-2. Since a voltage of 24 [V] is outputted from the output terminal of the voltage switching unit 12, a voltage of 0 [V], which is the voltage at the grounded side of the resistor 42, appears at the point $P_1$, and this voltage is inputted to the digital signal generation unit 14. This voltage of 0 [V] is different from the common voltage of 24 [V]. As a result, the digital signal generation unit 14 generates and outputs an OFF signal, which is a digital signal indicating the second state.

As illustrated in FIG. 8 and FIG. 9B, when an abnormality occurs in the switching switch 33 in the voltage switching unit 12, the output terminal 32 is not electrically connected to the input terminal 31-2. Hence the second voltage of 0 [V] is not outputted from the output terminal 32 of the voltage switching unit 12 from the moment of the occurrence of the abnormality and a voltage of $24 \times R_3/(R_1+R_3)$ [V] appears at the point $P_2$. The voltage determination unit 13, which periodically monitors the voltage outputted from the output terminal 32 of the voltage switching unit 12, detects a voltage of $24 \times R_3/(R_1+R_3)$ [V] instead of 0 [V] from the moment of the occurrence of the abnormality regardless of whether the operation switch 11 is open or closed. Therefore, the voltage determination unit 13 determines that the voltage outputted from the output terminal 32 of the voltage switching unit 12 has changed from 0 [V] to $24 \times R_3/(R_1+R_3)$ [V]. As a result, the digital signal output device 1 outputs an OFF signal, which is a digital signal indicating the second state, regardless of whether the contacts of the operation switch 11 are open or closed.

Next, some items of the digital signal output device according to one further embodiment of the present disclosure will be enumerated.

Figure 10A:
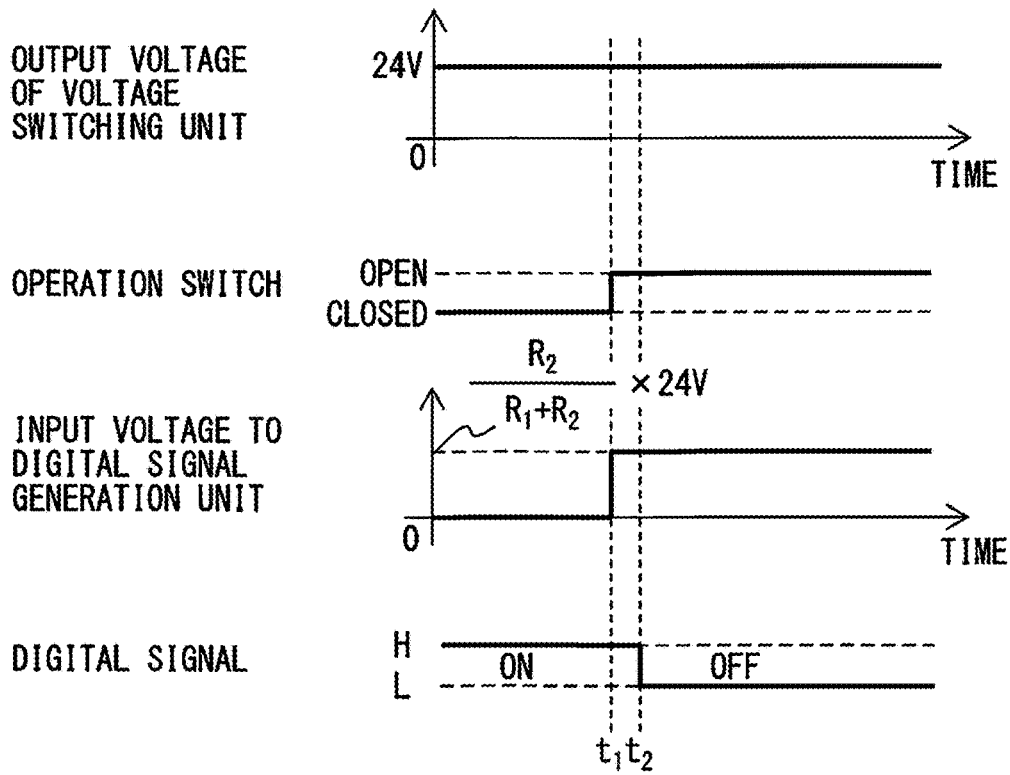
FIG. 10A is a diagram for describing the timing of the signal processing in the digital signal output device according to one embodiment of the present disclosure, with no abnormality in the switching switch in the voltage switching unit.
Figure 10B:
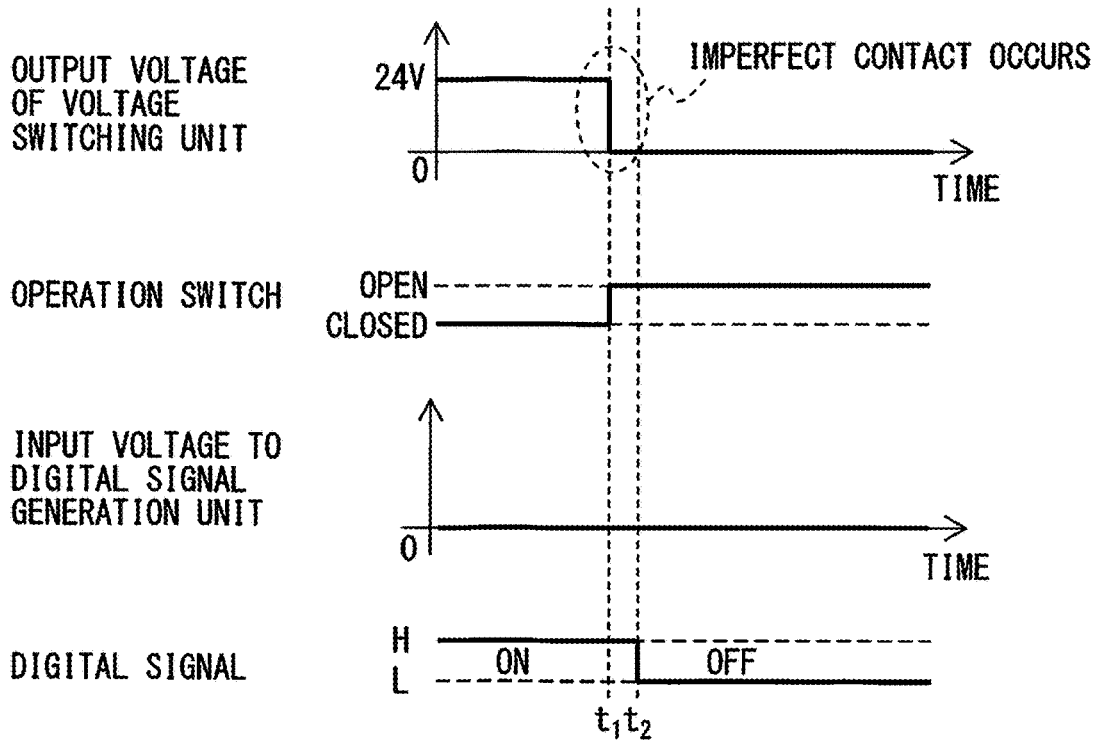
FIG. 10B is a diagram for describing the timing of the signal processing in the digital signal output device according to one embodiment of the present disclosure, with an abnormality in the switching switch in the voltage switching unit.

FIG. 10A is a diagram for describing the timing of the signal processing in the digital signal output device according to one embodiment of the present disclosure, with no abnormality in the switching switch in the voltage switching unit. FIG. 10B is a diagram for escribing the timing of the signal processing in the digital signal output device according to one embodiment of the present disclosure, with an abnormality in the switching switch in the voltage switching unit. With reference to FIG. 10A and FIG. 10B, the digital signal output device 1 will be described as an example in the case of the common voltage of 0 [V], as described with reference to FIG. 2, FIG. 3, FIG. 4A and FIG. 4B.

As illustrated in FIG. 10A, when there is no abnormality in the switching switch 33 in the voltage switching unit 12, a second voltage of 24 [V], which is different from the common voltage (first voltage), is outputted from the output terminal 32 of the voltage switching unit 12. The voltage determination unit 13, which periodically monitors the voltage outputted from the output terminal 32 of the voltage switching unit 12, continues to detect a voltage of 24 [V] regardless of whether the operation switch 11 is open or closed, and determines that the voltage outputted from the output terminal 32 of the voltage switching unit 12 has not changed from 24 [V]. When the contacts of the operation switch 11 are switched from the closed state to the open state at the time $t_1$, the voltage inputted to the digital signal generation unit 14 (the voltage at the point $P_1$ of FIG. 2) changes from 0 [V] to $24 \times R_2/(R_1+R_2)$ [V] and, in response to this, the digital signal generation unit 14 switches the outputs from the ON signal to the OFF signal. Let the time that the digital signal generation unit 14 takes to switch the output digital signals in response to the voltage change inputted thereto be $(t_2-t_1)$.

Assume, as illustrated in FIG. 10B, that an abnormality occurs in the switching switch 33 in the voltage switching unit 12 at the time $t_1$ and that the contacts of the operation switch 11 switched from the closed state to the open state at the same moment. In such a case, from the time $t_1$ onwards, the second voltage of 24 [V] is not outputted from the output terminal 32 of the voltage switching unit 12 and a voltage of 0 [V], which is the voltage on the grounded side of the resistor 42, appears at the point $P_2$. The voltage determination unit 13, which periodically monitors the voltage outputted from the output terminal 32 of the voltage switching unit 12, detects a voltage of 0 [V] instead of 24 [V] from the time $t_1$ onwards. Meanwhile the voltage inputted to the digital signal generation unit 14 (the voltage at the point $P_1$ of FIG. 2) remains at 0 [V] also from the time $t_1$ onwards. Thus the digital signal generation unit 14 switches the outputs from the ON signal to the OFF signal. As described with reference to FIG. 10A, the time the digital signal generation unit 14 takes to switch the output digital signals in response to the voltage change inputted thereto is $(t_2-t_1)$, the digital signal generation unit 14 outputs the OFF signal after the time $t_2$. As described above, when an abnormality occurs in the switching switch 33 in the voltage switching unit 12 at the same time (at the time $t_1$ of FIG. 10B) as the switching of the contacts of the operation switch 11 from the closed state to the open state, it is indistinguishable whether the switching from the ON signal to the OFF signal by the digital signal generation unit 14 is the result of the occurrence of an abnormality in the switching switch 33 or of the switching of the contacts of the operation switch 11 from the closed state to the open state. In addition, it is safer to output an OFF signal at the exact moment when an abnormality occurs in the switching switch 33 in the voltage switching unit 12. In a first item and a second item of one further embodiment of the present disclosure, the result of the determination by the voltage determination unit 13 is given priority in the generation processing by the digital signal generation unit 14 in one period of the processing cycle of the voltage determination unit 13 and the digital signal generation unit 14. Some example items of this embodiment will be enumerated below.

Figure 11:
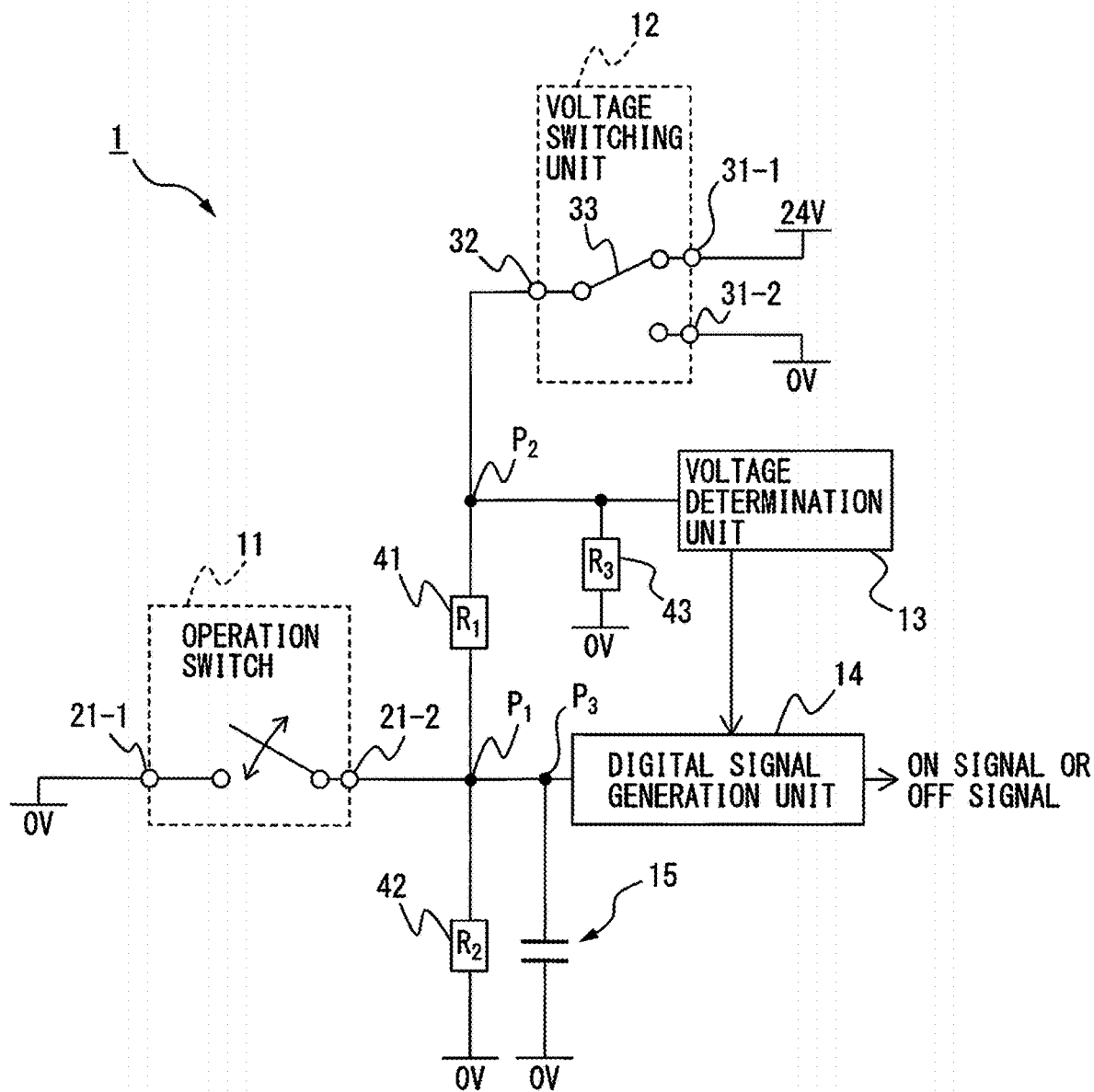
FIG. 11 is a schematic diagram illustrating a configuration of a digital signal output device according to a first item of a further embodiment of the present disclosure.

In the first item according to one further embodiment of the present disclosure, a filtering circuit is provided between the second terminal 21-2 of the operation switch 11 and the digital signal generation unit 14 to give priority to the result of the determination by the voltage determination unit 13 in the generation processing by the digital signal generation unit 14. FIG. 11 is a schematic diagram illustrating a configuration of a digital signal output device according to the first item of the further embodiment of the present disclosure.

As illustrated in FIG. 11, a filtering circuit 15 is provided at a point $P_3$ in the preceding stage to the digital signal generation unit 14. As described above, the determination process by the voltage determination unit 13 and the generation process by the digital signal generation unit 14 are repeatedly executed on the same cycle. Owing to the provision of the filtering circuit 15, the timing when the digital signal generation unit 14 acquires the voltage at the second terminal 21-2 of the operation switch 11 becomes later than the timing when the voltage determination unit 13 acquires the voltage at the output terminal 32 of the voltage switching unit 12 in one period of the processing cycle of the voltage determination unit 13 and the digital signal generation unit 14.

In the second item according to one further embodiment of the present disclosure, the timing when the voltage determination unit 13 acquires the voltage outputted from the output terminal 32 of the voltage switching unit 12 is set to be earlier than the timing when the digital signal generation unit 14 acquires the voltage at the second terminal 21-2 of the operation switch 11 in one period of the processing cycle of the voltage determination unit 13 and the digital signal generation unit 14 to give priority to the result of the determination by the voltage determination unit 13 in the generation processing by the digital signal generation unit 14. The timing when the voltage determination unit 13 acquires the voltage at the output terminal 32 of the voltage switching unit 12 is made earlier than the timing when the digital signal generation unit 14 acquires the voltage at the second terminal 21-2 of the operation switch 11 in one period of the processing cycle of the voltage determination unit 13 and the digital signal generation unit 14. As a result, upon receiving the result of the determination by the voltage determination unit 13 when an abnormality occurs in the switching switch 33 in the voltage switching unit 12, the digital signal generation unit 14 generates and outputs an OFF signal at once.

Figure 12:
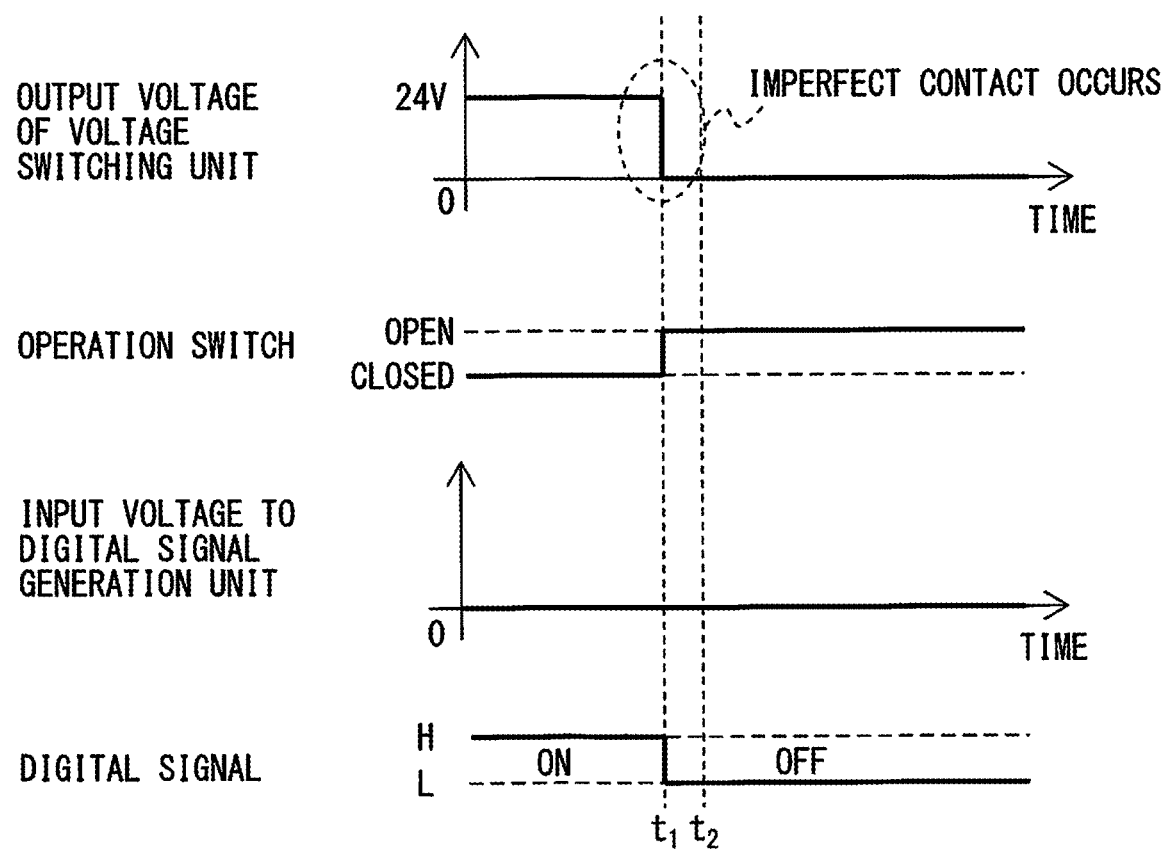
FIG. 12 is a diagram for describing the timing of the signal processing of the digital signal output device according to a first item and a second item of the further embodiment of the present disclosure.

FIG. 12 is a diagram for describing the timing of the signal processing of the digital signal output device according to the first item and the second item of the further embodiment of the present disclosure.

Assume, as illustrated in FIG. 12, that an abnormality occurs in the switching switch 33 in the voltage switching unit 12 at the time $t_1$ and that the contacts of the operation switch 11 switched from the closed state to the open state at the same moment. In such a case, from the time $t_1$ onwards, the second voltage of 24 [V] is not outputted from the output terminal 32 of the voltage switching unit 12 and a voltage of 0 [V], which is the voltage on the grounded side of the resistor 42, appears at the point $P_2$. The voltage determination unit 13, which periodically monitors the voltage outputted from the output terminal 32 of the voltage switching unit 12, detects a voltage of 0 [V] instead of 24 [V] from the time $t_1$ onwards. Thus the digital signal generation unit 14 switches the outputs from the ON signal to the OFF signal at the time $t_1$. As described above, according to the first item and the second item of the further embodiment of the present disclosure, when an abnormality occurs in the switching switch 33 in the voltage switching unit 12, the OFF signal is outputted earlier than in the case of FIG. 10B.

Note that, although a case in which the common voltage is 0 [V] has been described as an example for the first item and the second item of one further embodiment of the present disclosure as described above, the first item and the second item are applicable to a case with a common voltage of any other value.

Figure 13:
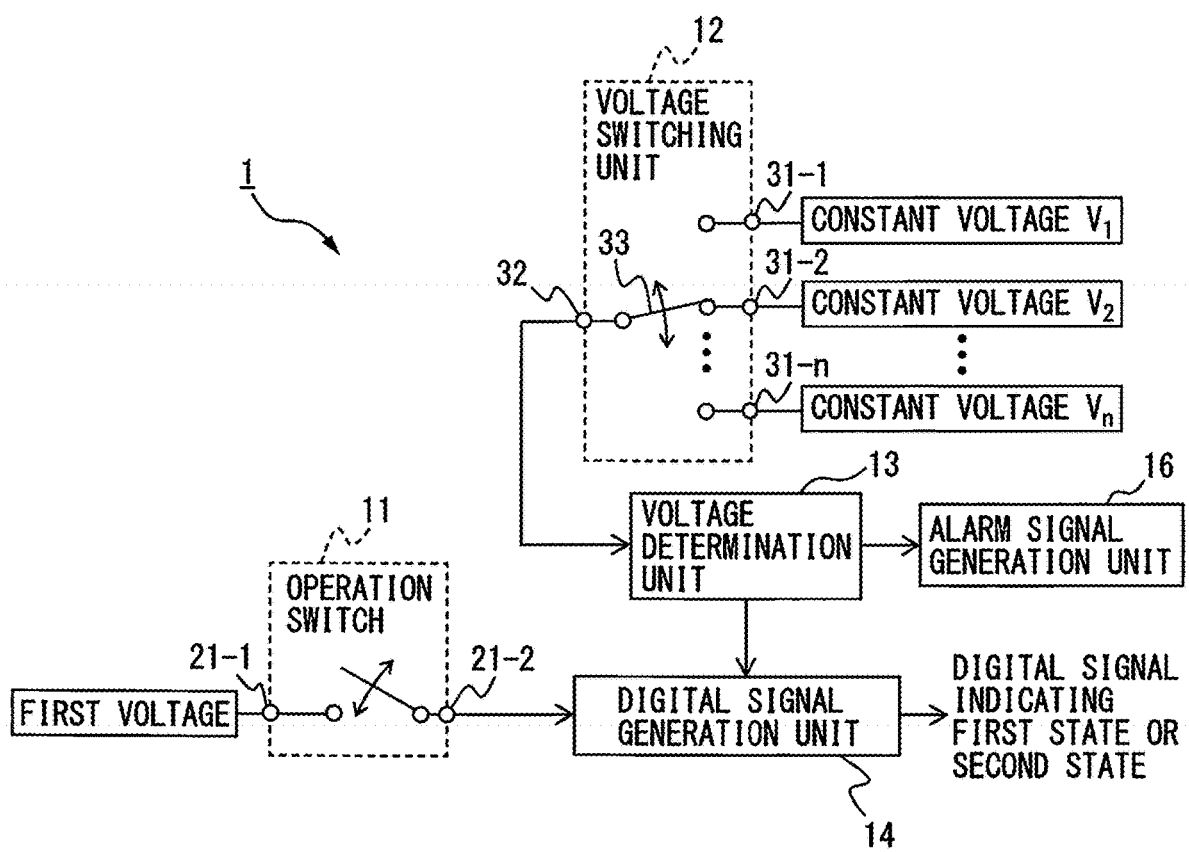
FIG. 13 is a schematic diagram illustrating a configuration of a digital signal output device according to a third item of the further embodiment of the present disclosure.

In a third item according to one further embodiment of the present disclosure, when an abnormality occurs in the switching switch 33 in the voltage switching unit 12, an alarm signal is separately generated in addition to the output of the OFF signal by the digital signal generation unit 14. FIG. 13 is a schematic diagram illustrating a configuration of a digital signal output device according to a third item of the further embodiment of the present disclosure.

As illustrated in FIG. 13, according to a third item of the further embodiment of the present disclosure, the digital signal output device 1 further includes an alarm signal generation unit 16 configured to generate an alarm signal that indicates an abnormality in the voltage switching unit 12 when the voltage determination unit 13 has determined a change from the second voltage, i.e., when an abnormality has occurred in the switching switch 33 of the voltage switching unit 12. The alarm signal generated by the alarm signal generation unit 16 is sent to the control apparatus of the machine tool or robot for which the digital signal output device 1 is provided. The control apparatus that has received the alarm signal can, for example, stop the alarm or execute a protection operation in relation to the machine tool or robot. As described above, with the alarm signal generation unit 16 outputting an alarm signal in addition to the digital signal generation unit 14 outputting the OFF signal (digital signal indicating the second state) when an abnormality occurs in the switching switch 33 of the voltage switching unit 12, it is possible to prevent hazard associated with the machine for which the operation switch is provided even more securely.

Note that the voltage determination unit 13, the digital signal generation unit 14, and the alarm signal generation unit 16 described above may be configured, for example, by a software program form or by a combination of various electronic circuits and a software program. When these are configured in a software program form, the functions of the above-described units can be realized by causing an operation processing unit to operate in accordance with the software program. Alternatively, the voltage determination unit 13, the digital signal generation unit 14, and the alarm signal generation unit 16 may be realized by a semiconductor integrated circuit with a software program written thereon for realizing the functions of these units. The operation processing unit that executes the software program for realizing the functions of the voltage determination unit 13, the digital signal generation unit 14, and the alarm signal generation unit 16 may be configured by a separate integrated circuit (IC) or may be provided in an operation processing unit in a machine tool, a robot, or the control apparatus thereof. The filtering circuit 15 may be configured by an analogue circuit or may be configured in a software program form and realized by causing an operation processing unit to execute the software program. The functions of the above-described units are realized.

According to one aspect of the present disclosure, it is realized a highly safety digital signal output device that prevents hazard associated with a machine for which an operation switch is provided when an abnormality occurs in the digital signal output device that outputs digital signals in accordance with the operation switch.

The invention claimed is:
1. A digital signal output device comprising:
an operation switch comprising contacts, a first terminal to which a first voltage is applied, and a second terminal from which the first voltage is outputted when the contacts are closed;
a voltage switching unit configured to select a second voltage different from the first voltage from among a plurality of constant voltages and outputs the second voltage;

a voltage determination unit configured to determine on a designated cycle whether or not a voltage outputted from the voltage switching unit has changed from the second voltage; and a digital signal generation unit configured to, when the voltage determination unit determines that the voltage outputted from the voltage switching unit has not changed from the second voltage, generate on every cycle a digital signal indicating a first state when the first voltage is outputted from the second terminal and a digital signal indicating a second state different from the first state when the first voltage is not outputted from the second terminal.

2. The digital signal output device according to claim 1, wherein the digital signal generation unit generates a digital signal indicating the second state when the voltage determination unit determines that the voltage outputted from the voltage switching unit has changed from the second voltage.

3. The digital signal output device according to claim 1, wherein the first voltage is a common voltage.

4. The digital signal output device according to claim 1, wherein one of the digital signals indicating the first state and the digital signal indicating the second state is an ON signal and the other is an OFF signal.

5. The digital signal output device according to claim 1, wherein the voltage switching unit comprises a plurality of input terminals to which different constant voltages are applied, an output terminal, and a switching switch that selectively switches among the plurality of input terminals for connection with the output terminal, and wherein the voltages applied to the plurality of input terminals include the second voltage.

6. The digital signal output device according to claim 1, further comprising a filtering circuit provided between the operation switch) and the digital signal generation unit.

7. The digital signal output device according to claim 1, wherein a timing when the voltage determination unit acquires a voltage outputted from the voltage switching unit is set to be earlier than a timing when the digital signal generation unit acquires a voltage of the second terminal in a period of the cycle.

8. The digital signal output device according to claim 1, further comprising an alarm signal generation unit configured to generate an alarm signal indicating an abnormality in the voltage switching unit when the voltage determination unit determines that the voltage outputted from the voltage switching unit has changed from the second voltage.

\* \* \* \* \*